United States Patent [19]

Lahmeyer

[11] Patent Number: 4,649,541
[45] Date of Patent: Mar. 10, 1987

[54] REED-SOLOMON DECODER

[75] Inventor: Charles R. Lahmeyer, Temple City, Calif.

[73] Assignee: The United States of America as represented by the Administrator of the National Aeronautics and Space Administration, Washington, D.C.

[21] Appl. No.: 673,685

[22] Filed: Nov. 21, 1984

[51] Int. Cl.⁴ ............................................. G06F 11/10
[52] U.S. Cl. .......................................... 371/37; 371/40
[58] Field of Search ......................... 371/38, 37, 39, 40

[56] References Cited

U.S. PATENT DOCUMENTS

| 4,162,480 | 7/1979 | Berlekamp | 371/37 |
| 4,410,989 | 10/1983 | Berlekamp | 371/37 |
| 4,566,105 | 1/1986 | Oisel | 371/37 |
| 4,567,594 | 1/1986 | Deodhar | 371/38 |
| 4,583,225 | 4/1986 | Yamada | 371/37 |

OTHER PUBLICATIONS

Lin, Shu, et al, Error Control Coding, Fundamentals and Applications, Prentice-Hall, Englewood Cliffs, N.J., 1983.

Primary Examiner—Michael R. Fleming
Attorney, Agent, or Firm—Paul F. McCaul; John R. Manning; Thomas H. Jones

[57] ABSTRACT

A Reed-Solomon decoder with dedicated hardware for five sequential algorithms is provided with overall pipelining by memory swapping between input, processing and output memories, and internal pipelining through the five algorithms. The code definition to be used in decoding is specified by a keyword received with each block of data so that a number of different code formats may be decoded by the same hardware.

9 Claims, 15 Drawing Figures

DATA WORDS AS RECEIVED
FROM HOST PROCESSOR

| KEYWORD ||
|---|---|
| 1 | 2 |
| 3 | 4 |
| 5 | 6 |
| | |
| 763 | 764 |
| 765 | X |

REED
SOLOMON
CODE
BLOCK

DATA SYMBOLS AS ASSEMBLED
IN DECODER RAM

| 1 | 2 | 3 |
|---|---|---|
| 4 | 5 | 6 |
| 7 | 8 | 9 |
| | | |
| 763 | 764 | 765 |

CODEWORD 1 | CODEWORD 2 | CODEWORD 3

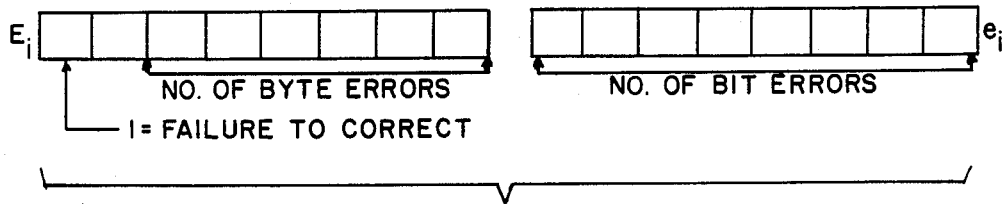

REED-SOLOMON DECODER

ORIGIN OF INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

This invention relates to decoding data that has been encoded with a Reed-Solomon code for transmission, and more specifically to decoding Reed-Solomon encoded data containing check bits.

When transmitting data from spacecraft, noise interference can be greatly reduced by encoding the data in one of the known error correcting codes. However, these codes require that extra "overhead" bits be transmitted along with the data, which reduces the rate of data transmission. Among the most sophisticated and powerful codes, the Golay and the convolutional codes require as much as a 50% overhead, thus effectively halving the data rate. Reed-Solomon codes, discussed in the article "Polynomial Codes Over Certain Finite Field" by I. S. Reed and G. Solomon, J. Soc. Industr. Appl. Math, Vol. 8, No. 2, pp 300-304, June, 1960, require fewer overhead bits and are therefore quite attractive.

Several space missions have Reed-Solomon encoders on board, and Reed-Solomon decoders on the ground, such as the Galileo Mission. However, commercial Reed-Solomon decoders are unavailable for the code format adopted for the Galileo Mission, a format which requires only a 15% overhead. Only one Reed-Solomon decoder has even been produced commercially; it operated with a different format and was too slow for the required data rate from Galileo. This decoder, described in U.S. Pat. No. 4,162,480 by Elwyn R. Berlekamp, used general purpose microcomputers to operate the decoding processes, which required a minimum of hardware but caused many internal delays during processing.

The present invention has the ability to decode three formats, including the Galileo and the potential of decoding other formats as well. The design philosophy is to use dedicated hardware for higher speed operation, and to pipeline data processing throughout, and internally within each stage as well. Although this requires more hardware than the microprocessor approach, which is tolerable on ground equipment, it eliminates delays by allowing processing to begin on a second word before it is fully completed on a first word, and calculations are more direct. In addition, the dedicated hardware can be operated at a higher clock rate than can general purpose computers.

SUMMARY OF THE INVENTION

In accordance with the present invention, an encoded data stream is pipelined through input means to memory means having three identical memories, each with its own addressing network and output terminals. There the input data is stored in one while previously input received data stored in another is decoded, and decoded data stored in the third is transmitted out. When all three functions (input, decoding and output) are done, switching means automatically swaps memories, the memories coupled to the three parts, such that the second becomes the third for output of decoded data, the third becomes the first for input of new data, and the first becomes the second for decoding data. The decoding means is comprised of a plurality of sections, each for carrying out an algorithm step, and each internally pipelined such that the data is pipelined through the decoding means. The data received is encoded in a Reed-Solomon code consisting of codewords made up of K data and N-K check symbols, where N is an arbitrary number and K is a number smaller than N. Each symbol is made up of J binary bits, encoded with a generator polynomial g(X) for the code and a field generating polynomial M(X) which defines the representation of the Galois field. The sequential algorithmic steps are:

1. Syndrome Generation for generating a syndrome $S(X) = S_m X^{m-1} + S_{m-1} X^{m-2} \ldots + S_2 X + S_1$ where $m = 2^n$.

2. Euclid's Algorithm for determining the error locator polynomial $\sigma(X) = \sigma_j X^j + \sigma_{j-1} X^{j-1} \ldots + \sigma_1 X + \sigma_o$ where $1 \leq j \leq m/2$ and the error magnitude evaluator polynomial $\omega(X) = \omega_i X^i + \omega_{i-1} X^{i-1} \ldots + \omega_1 X + \omega_o$ where $i = j - 1$.

3. Chien Search for computing the roots $\beta$ of the error locator polynomial $\sigma(X)$ to determine the location of errors.

4. Error Magnitude Computation for determining the error magnitudes $E\beta$ from the derivative $\sigma'(X)$ of the error locator polynomial, the error magnitude evaluator polynomial $\omega(X)$ and the root $\beta$ of the error locator polynomial by computing $\sigma'(\beta)$ and $\omega(\beta)$, and the computing $E\beta = \sigma'(\beta)/\omega(\beta)$.

5. Correction of errors by adding the error magnitudes at the proper locations. The location of an error associated with a root $\beta$ is found by taking the negative logrithm, $-\log \beta$.

Once the five decoding steps have been completed in sequence, the three memories are swapped so that the data pipelined through the last step and stored in the one of three memories used while decoding is automatically presented to the output means.

The novel features of the invention are set forth with particularity in the appended claims. The invention will best be understood from the following description when read in connection with the accompanying drawings.

BRIEF DESCRIPTION OF THE DRAWINGS

FIGS. 3a, b and c illustrate data format for data transmission from decoder to host computer.

DETAILED DESCRIPTION OF THE DRAWINGS

Figure 1:
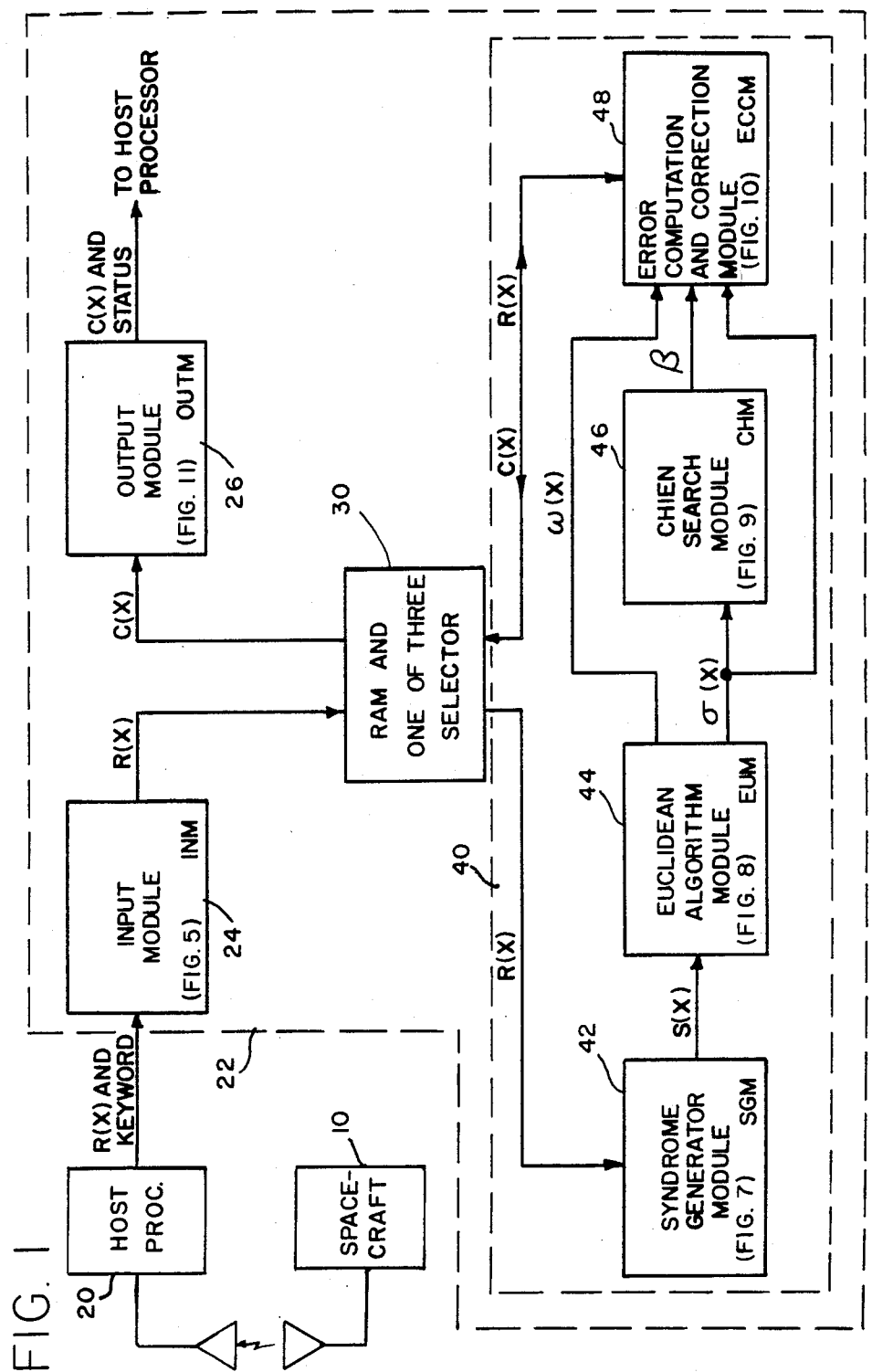
FIG. 1 is a block diagram of the decoder of the present invention.

Referring to FIG. 1, a spacecraft 10 transmits data (which has been encoded in one of a plurality of established Reed-Solomon code formats for error detecting and correcting) to a host processor 20 at a ground station. The host processor then transmits the received data, R(X) and a keyboard (which, among other things, identifies the Reed-Solomon code being used), to a Reed-Solomon decoder 22 for decoding and correction of byte and bit errors in accordance with the present invention.

The basic parameters for the Reed-Solomon code are codeword length (N), symbol size (J), error correction capability (E) and interleaving depth (I). Also of interest are the field generating polynomial, M(X) and the generator polynomial for the code g(X). In the present invention:

N=255 symbols of J bits per symbol.
J=8 bits.
E=16, i.e., the code will correct all patterns of 16 or fewer symbol errors.
I=1 through 7. Interleaving depth may be any value from 2 to 7 provided it is done on a symbol-by-symbol basis not a bit-by-bit basis. I=1 represents the noninterleaved case.
$M(X)=X^8+X^4+X^3+X^2+1$. This polynomial defines the representation of the Galois field $GF(2^8)$.

$$g(X) = \prod_{n=1}^{32} (X - \alpha^n) = (X - \alpha)(X - \alpha^2) \ldots (X - \alpha^{32}).$$

Figures 2A, 2B, 2C:
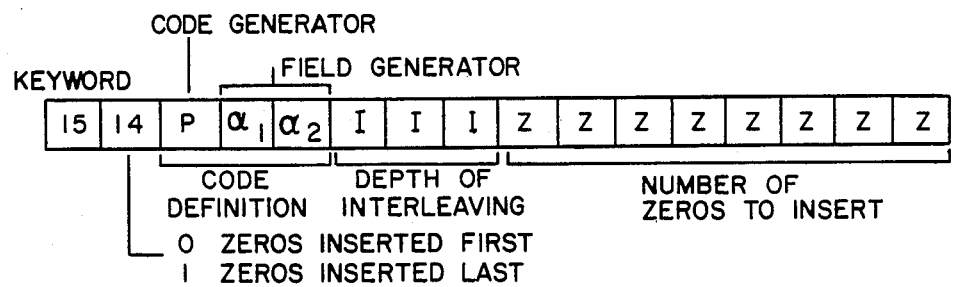
FIGS. 2a, b and c are illustrations of data transmission and storage format for data transmission from host processor to decoder.

The generator polynomial for the code g(X) defines the way decoding must be done. In the example shown in FIGS. 2a, b and c, data words, as received from the host processor are arranged in code blocks of 765 symbols, as shown in FIG. 2a, and then assembled into three codewords of 255 symbols each, as shown in FIG. 2b. Thus, as used herein, the term "symbol" refers to an 8-bit element from the Galois Field of 256 elements or $GF(2^8)$. A codeword is 255 symbols or 2040 bits. It consists of 223 symbols of data and 32 parity check symbols, for a total of 255 symbols. A code block is three codewords, or 765 symbols, an amount of data equal to 2040 bits times the interleave depth. Several codewords may be interleaved together to enhance the code performance by allowing longer bursts of errors to be corrected. Data within the code block is not rearranged, but the codewords are interleaved within the block.

When a spacecraft has less than a full block of data to transmit to the decoder at a ground station, it inserts enough zeros to fill 223 symbols per codeword, generates parity in the usual way then removes the zeros before transmission through space. Each data block sent to the decoder must contain the keyword followed by $(255-Z) \times I$ bytes of data, where I is the interleave depth and Z is the number of zeros to be inserted.

The host processor must determine how many zeros to reinsert and inform the decoder by means of an 8-bit binary number called Z which is contained in the keyword shown in FIG. 2c. In addition, it is possible that the zero symbols could be inserted either before the data symbols or after the data symbols, but before the parity symbols. Therefore, the keyword must contain one bit to specify in which of the two locations the zeros are to be reinserted. In order for decoding to take place, the host processor at a ground station must transmit a 16-bit keyword with a code block of 8-bit symbols arranged in pairs, as shown in FIG. 2a. The keyword is used by the decoder 22, which assembles the data symbols in a decoder RAM 30 as shown in FIG. 2b. After decoding occurs, the decoder will return to the host processor 20 the corrected data and information about the number of bytes in error and the total bit errors as shown in FIGS. 3a, 3b and 3c.

Referring to the keyword format shown in FIG. 2c, the first bit 15 is not used at this time and should be set to zero. Bit 14 specifies the position of the zeros to be inserted (0=zeros inserted before the data; 1=zeros inserted after data). Bit 13 specifies whether the code generator polynomial is a palindrome (Bit 13=1) or the original polynomial (the product of the first 32 powers of alpha). Bits 12 and 11 specify the field generator polynomial used. For example, 00 calls for the Voyager generator polynomial, and 01 calls for the Berlekamp code. Thus, up to four different field polynomials may be specified. Bits 10, 9 and 8 specify the depth of interleaving, I (a 3 bit binary number from 1 to 7). Bits 0 through 7 comprise Z, the number of zero bytes to be inserted in each codeword. Z is an 8-bit binary number and can have any value from 0 through 223.

The data block following a keyword is composed as follows. First there are $(223-Z) \times I$ data bytes followed by $32 \times I$ parity bytes. This string of bytes is downloaded to the decoder in 16-bit words with the first byte being the most significant byte in the word. If the last word contains only one useful byte then it becomes the MSB and the other byte (X) may have any value. Thus, the input to the decoder 22 (FIG. 1) received from the host processor is as shown in FIG. 2a is essentially the Reed-Solomon code block transmitted by the spacecraft 10 (FIG. 1).

As directed by the interleaving value in the keyword, the decoder 22 deinterleaves its incoming data and stores it in its internal RAM memory 30 in reassembled codeword form, as illustrated in FIG. 2b. Once processed and corrected for errors, the codewords are stored in the RAM as shown in FIG. 3a. After decoding, the data block returned to the host processor will contain the corrected data bytes followed by the error counts as shown in FIG. 3b. The parity bytes are not returned. The data bytes will be arranged exactly as they were downloaded, i.e., sent to the decoder by the host processor. Immediately following the last byte of data will be the error bytes shown in FIG. 3c. These are called E (total bytes corrected) and e (total bits corrected). E and e bytes give error counts for one codeword only. Thus there will be one E and one e per codeword and there are three codewords in a block for I=3. These are appended to the data with no gaps, and this block is then uploaded (i.e., sent back) to the host processor in 16-bit words with the first 8-bit byte being the most significant in a word. The last word may contain an unnecessary byte (X) in the LSB position. The first bit in the E byte is the "failure to correct" bit which will only be set if the decoder was unable to perform decoding on that codeword due to an excessive number of errors. The decoder does not transmit the keyword back to the host processor 20 (FIG. 1), and omits the inserted zeros.

FIG. 1 shows the organization of the decoder 22 in accordance with the present invention. It includes an input module 24, a RAM memory 30, processing means 40 and output module 26. The processing means 40 is comprised of a syndrome generator module 42, an Euclidian algorithm module 44, a Chien search module 46, and an error computation and correction module 48. The modules of the processing means 40 perform the required operations in the sequence shown by the connecting lines using dedicated hardware. It employs pipeline data processing throughout, both within the modules (functional blocks) and within the overall decoder. The use of a RAM interface with the input and output modules eliminates data transfer delays by keeping data in place in memory while switching access to modules 42 and 48 as needed. The processing means operates on polynomials by passing them through FIFOs, treating each term sequentially as it appears at FIFO outputs. This allows processing to begin on a second word before it is fully completed on a first word, and calculations are more direct. In addition, the dedicated hardware can operate at a higher clock rate than can programmed microprocessors, or a general purpose computer.

Figure 4:
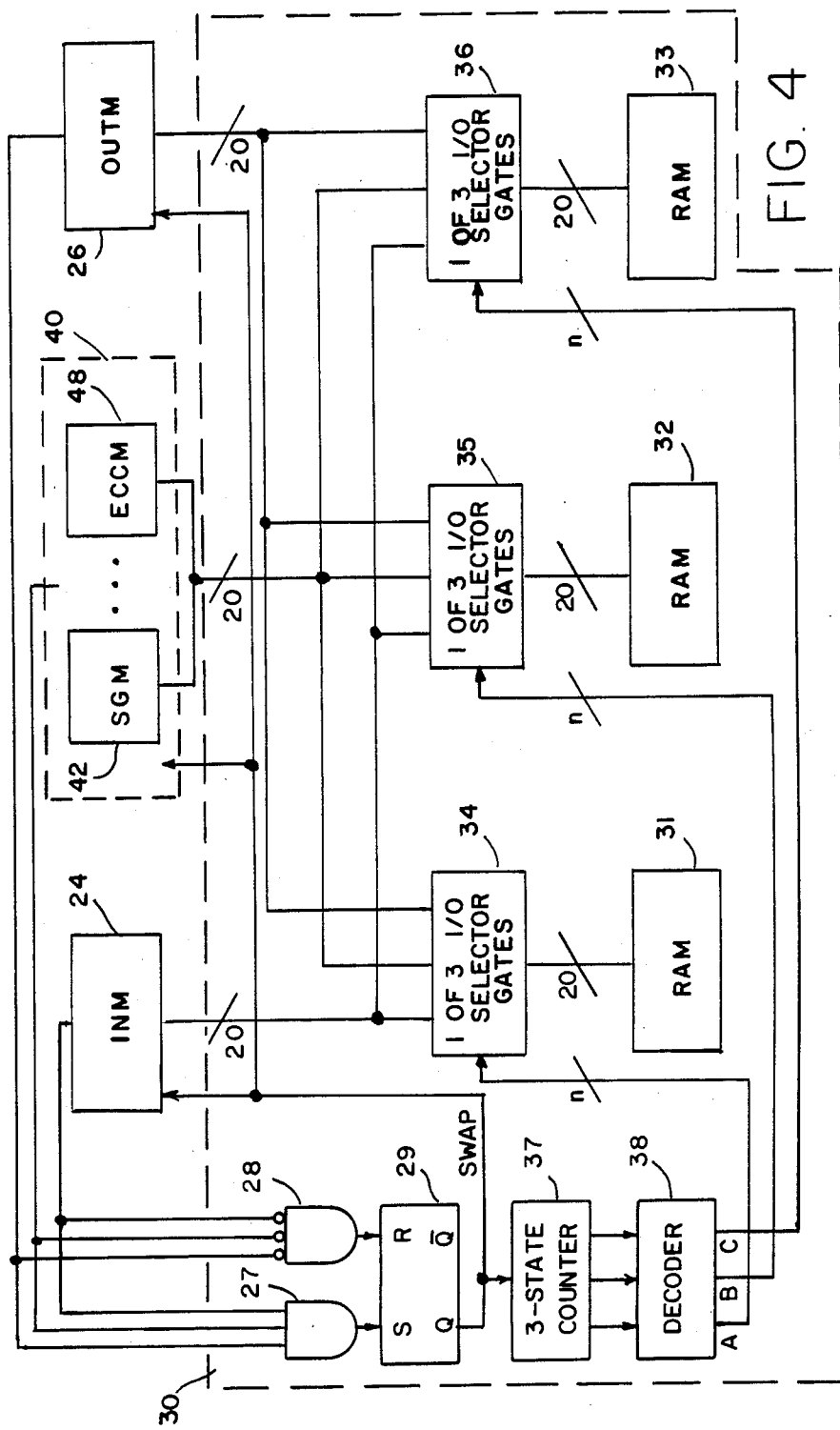
FIG. 4 is a block diagram of a RAM module used in the present invention.

The RAM module shown in FIG. 4 consists of three RAM segments 31, 32 and 33, each configured as 2K word of 8 bits. Each RAM segment can thus store more than one codeword. The RAM memory 30 is accessed by two modules in the decoding means 40 during decoding, namely the syndrome generator module (SGM) 42 at the beginning end of the pipelined decoding means 40, and the error computation and correction module (ECCM) 48 at the finishing end. It is also accessed by the input module (INM) 24 and the output module (OUTM) 26 which provide the necessary interface with the host processor.

Thus the Reed-Solomon decoder 22 can be thought of as having three main parts, each of which needs access to the RAM. These three parts are the input module 24, decoding means 40 and output module 26, as shown in FIGS. 1 and 4. At any given instant in time, each of the three parts is connected to one of three RAMs through a 1-of-3 I/O selector gates 34, 35 and 36. Each of the three parts is also connected for control to a 3-state counter 37 shown in FIG. 4. The 3-state counter is coupled to a decoder 38 which in turn enables a selected one of the 1-of-3 I/O selector gates 34, 35 and 36.

The state of the counter 37 is controlled by each of the input module 24, processing means 40 and output module 26 through AND gate 27 and NOR gate 28 at respective set (S) and reset (R) input terminals of a flip-flop 29. When gate 27 receives a DONE signal from each of the three parts, 24, 40 and 26, it sets the flip-flop, which results in a clock pulse called SWAP being sent to the 3-state counter 37. The SWAP signal is also sent to all three parts 24, 40 and 26 which then drop their respective DONE signals causing NOR gate 28 to become active, which resets flip-flop 39. The SWAP signal causes counter 37 to advance one state and via decoder 38 to effect the swapping of all RAM data and address lines in a sequential 3-state pattern. This has the effect of moving the data from one processing step to the next, once all three parts are done with their steps, without any physical movement of the data actually taking place, where the processing steps are to input data, process data and output data in code blocks. In the second step, namely processing data through means 40, the data is automatically pipelined through the modules 42, 44, 46 and 48 shown in FIG. 1. This arrangement allows overlapping, since all blocks of data are accessible to the input, processing and output modules at the proper times. In that manner, overall pipelining is accomplished, as well as internal pipelining within the decoding means 30. The output module 26 can begin outputting the first code block while the modules in the decoding means work on a second block, and the input module takes in a third code block. This is shown in the following table:

|  | RAM SEGMENT | | |
| --- | --- | --- | --- |
|  | 1 | 2 | 3 |
| State A | INPUT | PROC. | OUTPUT |
| State B | PROC. | OUTPUT | INPUT |
| State C | OUTPUT | INPUT | PROC. |

When the first RAM unit is in the input mode, the second is in the processing mode and the third is in the output mode. When the swap occurs under control of the decoder 38, the gates 34, 35 and 36 are switched and now the first RAM unit is in the processing mode, the second is in the output mode, and the third is in the input mode. The next swap effects switching in each of the selector gates 34, 35 and 36, and then the first RAM unit is in the output mode, the second in the input mode, and the third in the processing mode.

The RAM "swapping" feature is central to the overall pipeline operation of the decoder. In summary, it consists of the 3-state counter 37 which increments only after all three operations (input, data processing, output) are "done" on three different code blocks. At this point, the swap occurs and data effectively moves down the overall pipeline, but in actuality remains in the same RAM unit from the time it is input to the time it is output. The swapping is accomplished by switching all of the address lines and all of the data lines using 74S244 tri-state buffer devices. The purpose of this approach is to eliminate the delay time required to actually transfer data from one module to another inside the decoder 22, where the decoding means 40 is considered as one module, although comprised of several through which data is pipelined so that there is both overall pipelining, as described with reference to FIG. 4, and pipelining in the data decoding means 40 where decoding and error correcting takes place.

Figure 5:
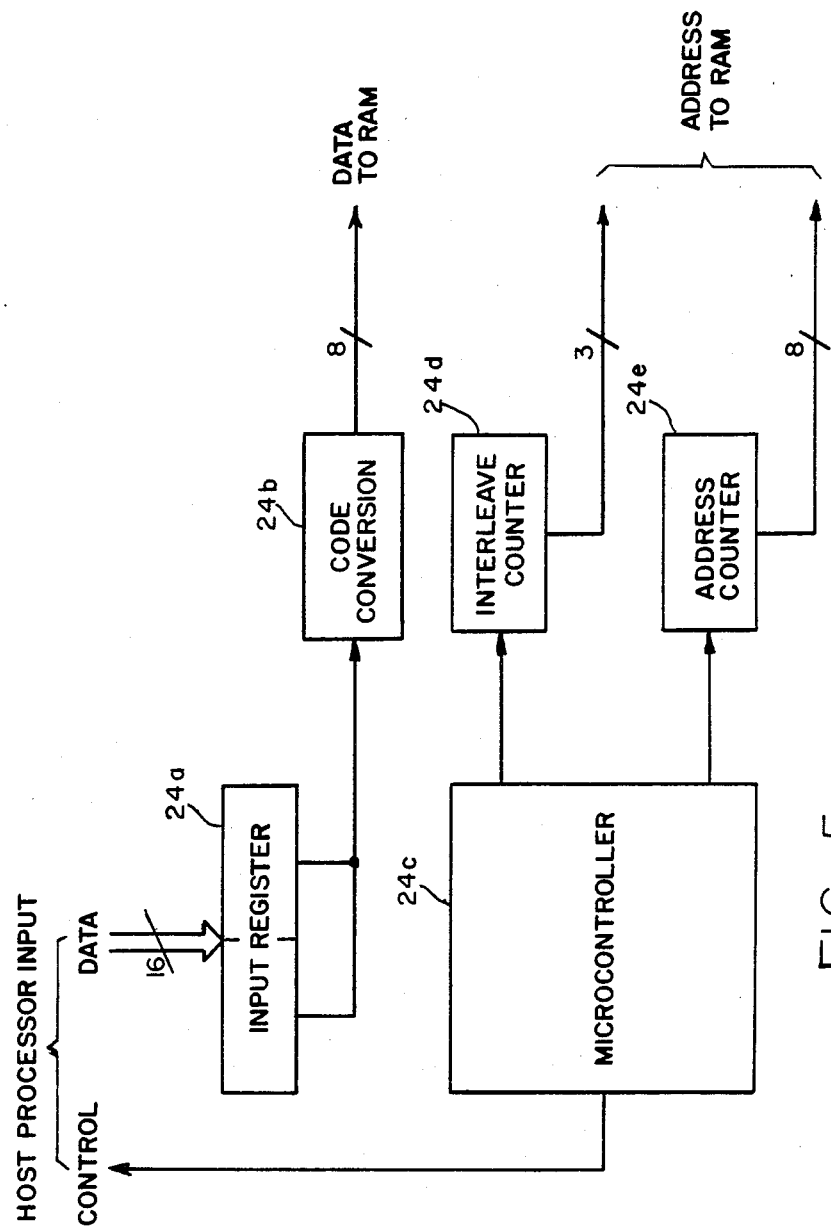
FIG. 5 is a block diagram of an input module used in the present invention.

The organization of the input module 24 is shown in FIG. 5. It is primarily a controller which must determine where to store incoming data in a RAM unit. The data is received in input register 24a. Code conversion, shown by block 24b, may be optionally provided in transferring the input data to the RAM 30 (FIG. 1). A microcontroller (microprogrammed controller) 24c generates a series of addresses for the RAM unit. It does this by first examining the keyword (the first input word) to determine depth of interleaving (I) and the number of zeros to reinsert (Z). It then presets an interleave counter 24d and an address counter 24e which generate the proper sequence of addresses. At the proper time, it drives the data lines to zero and proceeds to increment the RAM address counters 24e and 24d, thus effecting the zero reinsertion. The keyword also gets stored in RAM. It should be recalled that the 1-of-3 I/O selector gates determine which RAM unit is addressed to receive the input data. For example, if I, the interleaved depth is equal to three and Z, the number of zero bytes to be inserted is 7, then the data lines would be driven to zero and the address counter 24 started at 1. Then while the counters 24e and 24d are incremented in turn and the address counter 24e tracks the Z number (i.e., is decremented seven times) zero symbols will be written into RAM to complete the zero insertion process. In other words, for each count of the address register 24e, the counter 24d increments from 1 to 3 and back again. A similar cycle is performed for the data transfer with the initial number stored in the address counter 24e being 223−7 or 216. When this process is completed $(255-Z) \cdot I$ data symbols will have been loaded into a RAM unit with $Z \cdot I$ zeros inserted.

Figure 6:
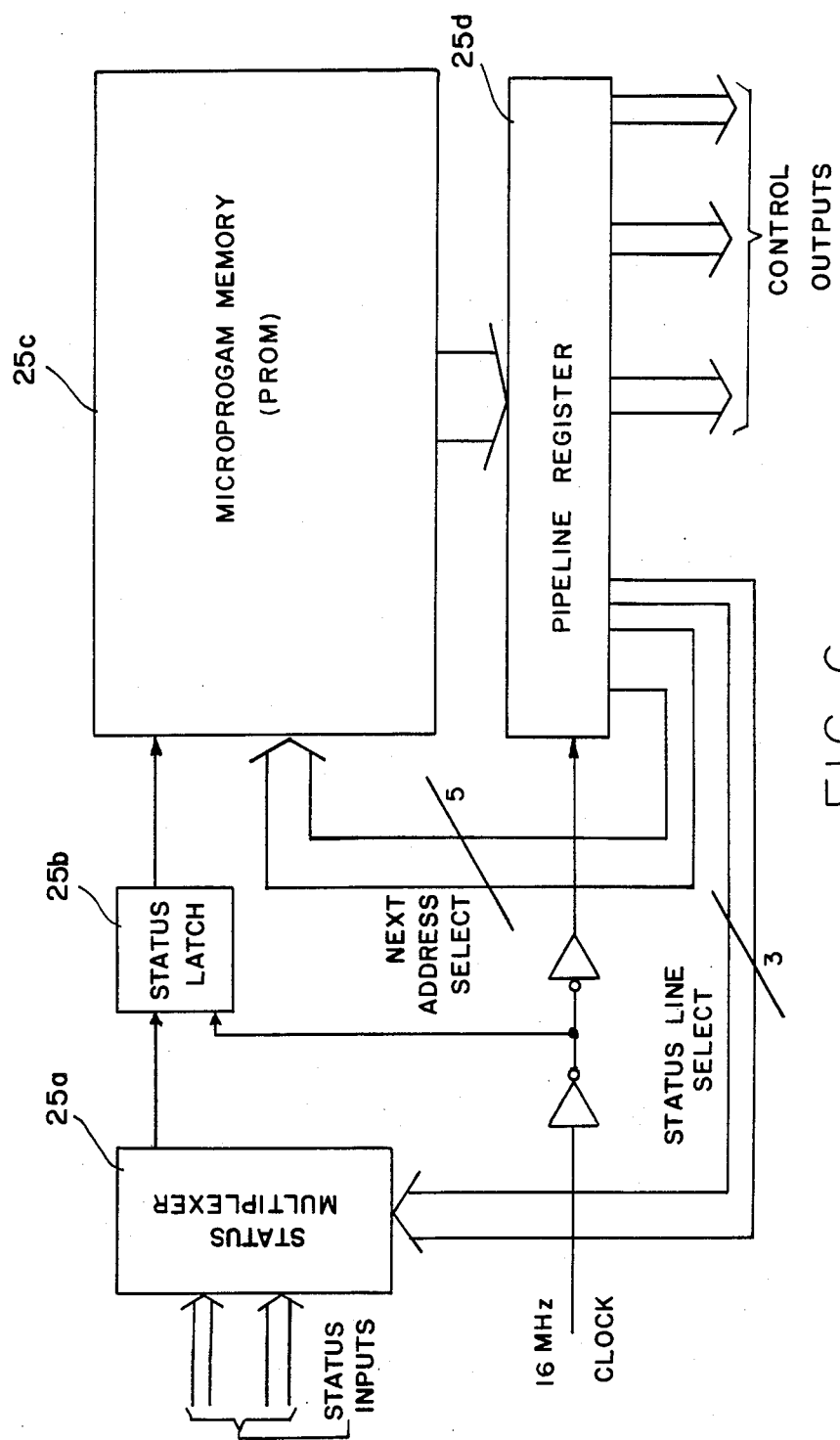
FIG. 6 is a block diagram of a microprogrammed controller used in several modules.

FIG. 6 shows an arrangement for a microcontroller used in the modules of the processing means 40 (FIG. 1). It comprises a status multiplexer 25a which receives status inputs of the module being controlled, a status latch 25b and a microprogram memory (PROM) 25c. A pipeline register 25d receives control words from the PROM as they are read out to provide control outputs to the module, and status line select outputs which control the multiplexer to select the status input for the next control word to be selected in conjunction with the next address select code from the control word in the pipeline register. For a more complete description of the organization and operation of this microcontroller (microprogrammed controller), reference is made to application Ser. No. 587,749 filed by the same inventor on Mar. 9, 1984, which is fully incorporated herein by reference. What is central to the microprogrammed controller is that the selected status signal and the next address code of the current control word select the next control word. Control is thus conditional in that the next control word is taken from one section of PROM or another, depending upon whether the selected status signal is 1 or 0.

Figure 7:
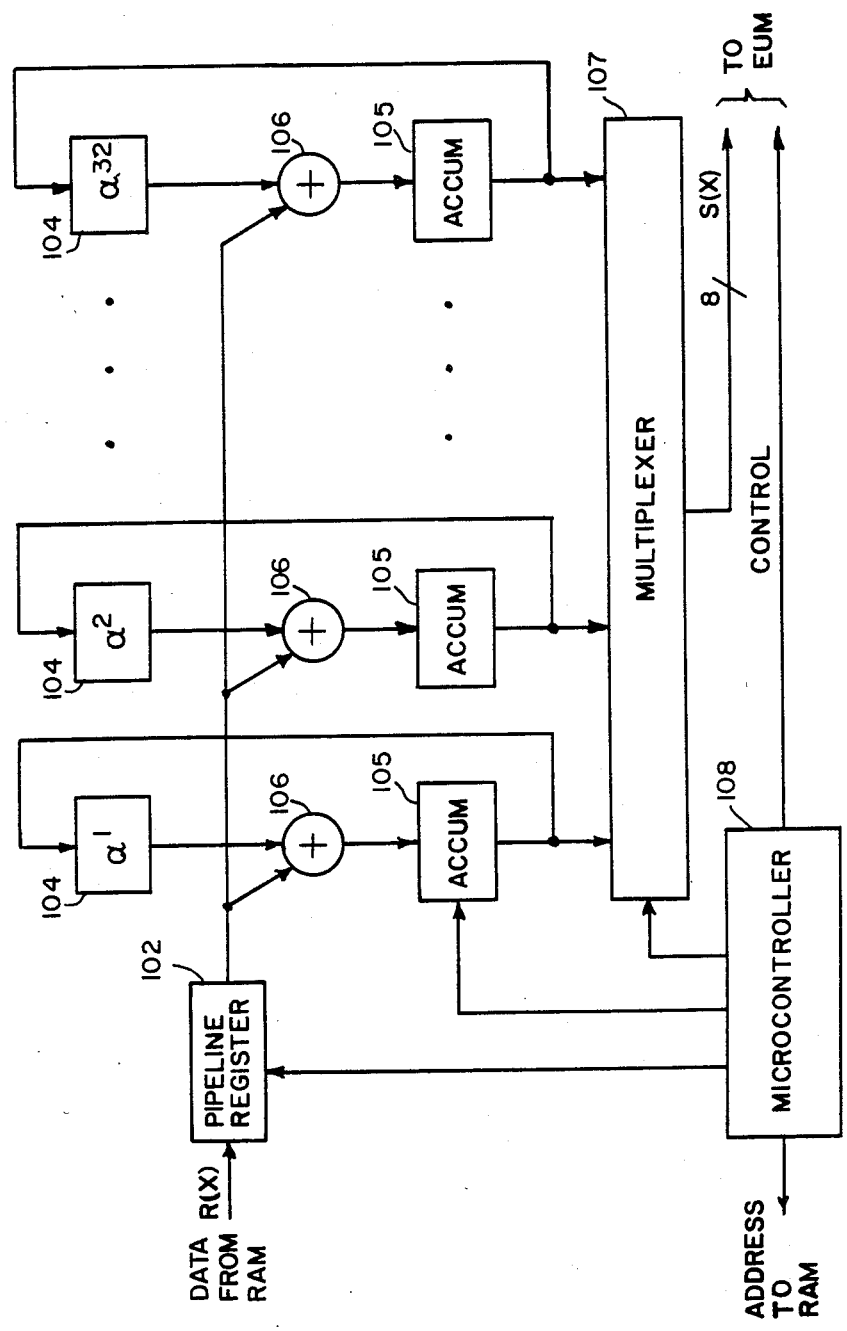
FIG. 7 is a block diagram of a syndrome generator module.

Before describing the processing means 40 in more detail, the basic algorithm used will be described. It consists of five steps, each of which is of itself conventional, implemented by separate modules, as follows:

(1) Syndrome Generation (FIG. 7)

This algorithm consists of a matrix multiplication composed of 16,320 individual arithmetic operations, which yields the syndrome, S(X), which consists of 32 terms and has the form:

$$S(X) = S_{32}X^{31} + S_{29}X^{30} \ldots + S_2X + S_1$$

It is derived from the received codeword which may be expressed as follows:

$$R(x) = R_0 + R_1X + R_2X^2 + \ldots + R_{253}X^{253} + R_{254}X^{254}$$

Each of the 32 coefficients of the symdrome are evaluated using the following expression:

$$S_n = \sum_{i=0}^{254} R_i \alpha^{i \cdot n}$$

$$= R_0\alpha^0 + R_1\alpha^{1 \cdot n} + R_2\alpha^{2 \cdot n} + \ldots + R_{253}\alpha^{253 \cdot n} + R_{254}\alpha^{254 \cdot n}$$

$$= R_0 + \alpha^n(R_1 + \alpha^n(R_2 + \ldots + 6^n(R_{253} + \alpha^n R_{254})) \ldots )$$

Figure 8:
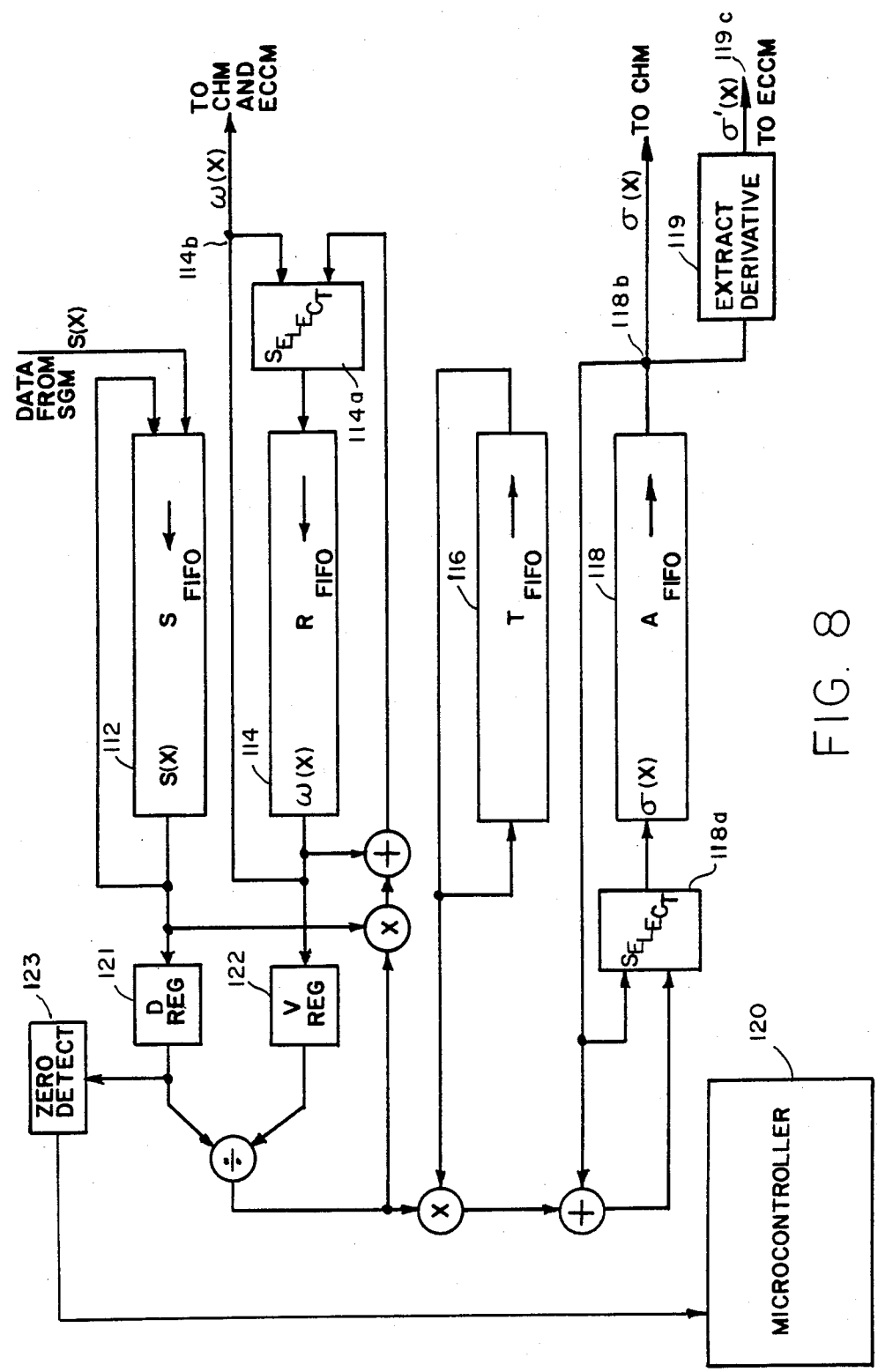
FIG. 8 is a block diagram of an Euclid's algorithm module.

(2) Euclid's Algorithm (FIG. 8)

This step consists of finding the greatest common divisor of two polynomials by performing a series of polynomial divisions. This yields the error locator polynomial, $\sigma(X)$ and the error magnitude evaluator polynomial $\omega(X)$.

Figure 9:
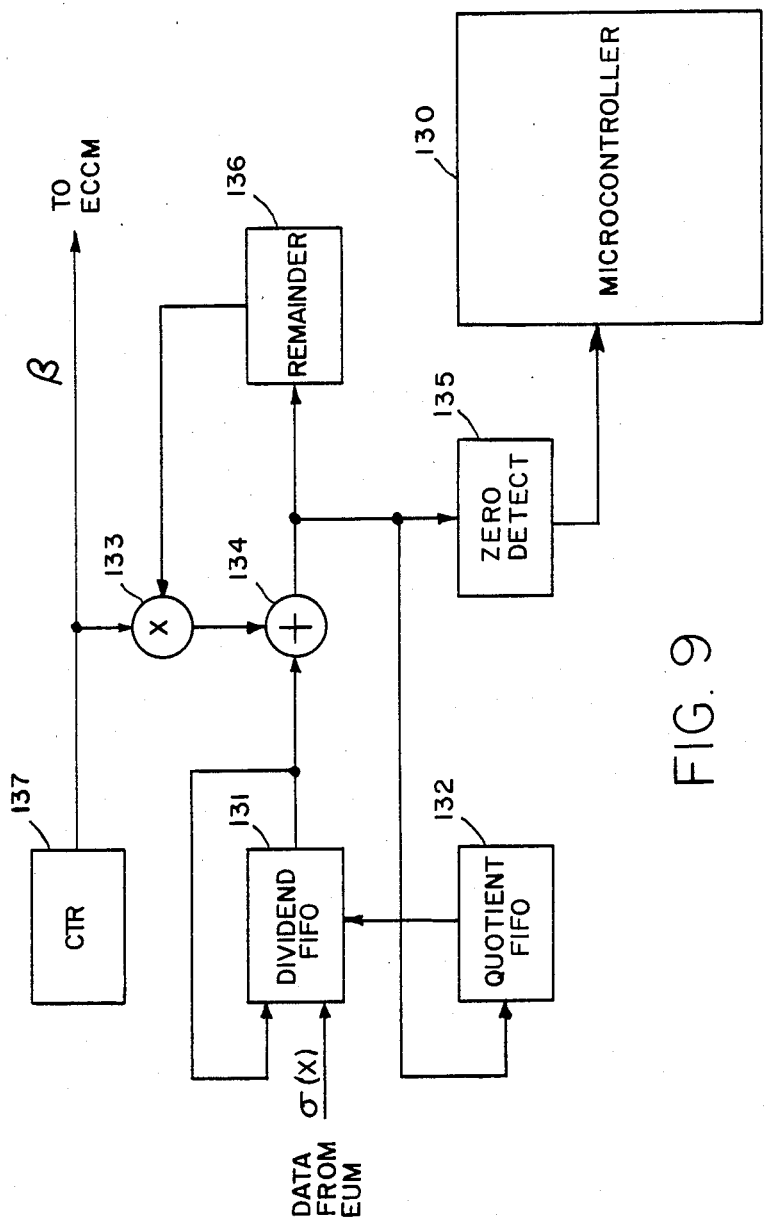
FIG. 9 is a block diagram of a Chien search module.

(3) Chien Search (FIG. 9)

This step is the process of locating the errors by finding the roots of the error locator polynomial. These roots are called $\beta$'s.

Figure 10:
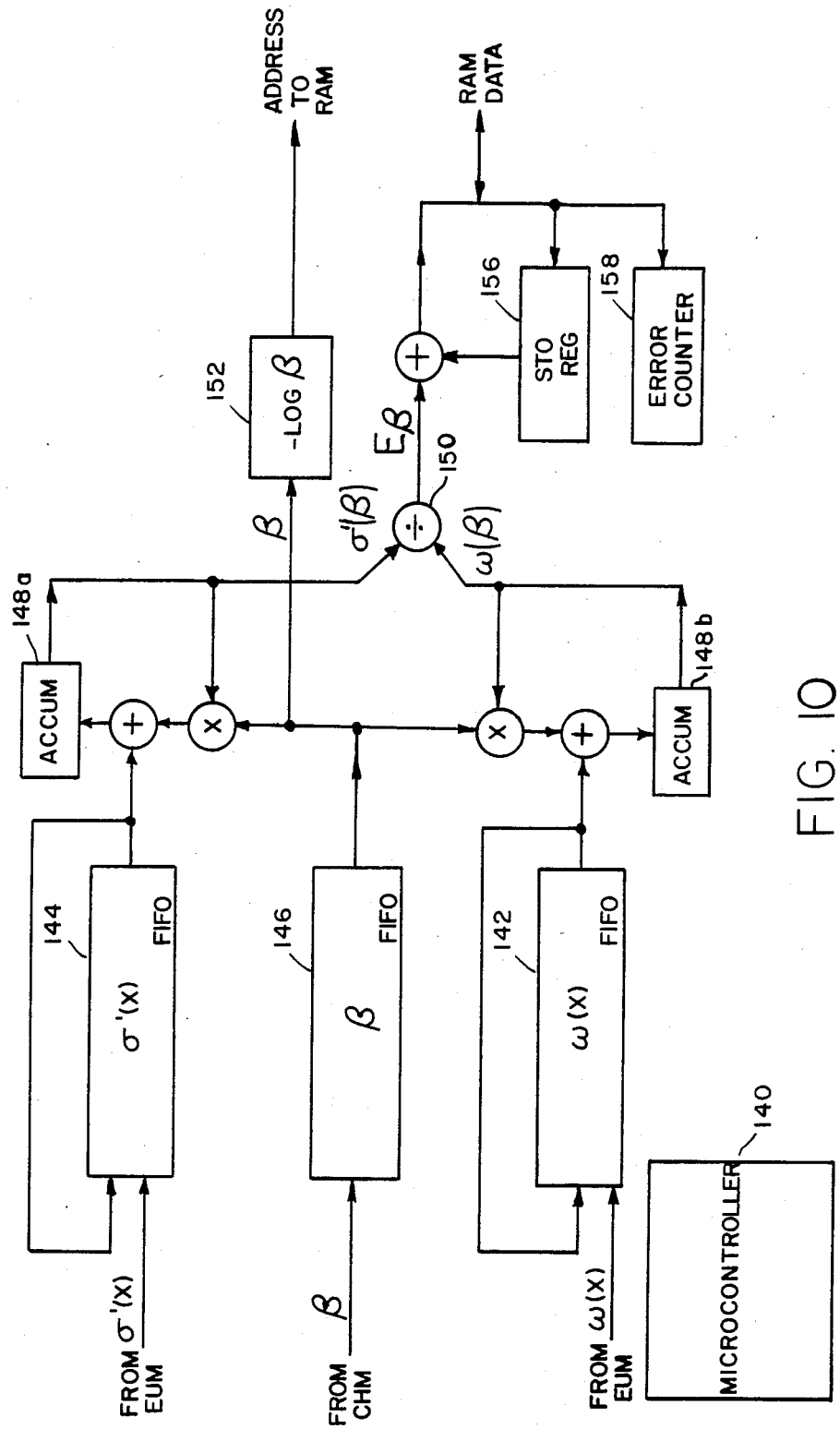
FIG. 10 is a block diagram of an error computation and correction module.

(4) Error Magnitude Computation (FIG. 10)

This step is the determination of the error magnitudes by first evaluating $\omega(\beta)$ and $\sigma'(\beta)$ and then dividing the two, as shown below. This yields the error magnitudes, called E's. The location of an error associated with a root, $\beta$, is found by taking the negative logarithm, i.e., Address of error $= -\log \beta$ The magnitude of the error is found by evaluating the following expressing at $\beta$:

$$E\beta = \omega(X)/\sigma'(X),$$

where $X = \beta$ $$\omega(X) = \omega_nX^n + \omega_{n-1}X^{n-1} + \ldots \omega_1X + \omega_0$$

with n having a value equal to the number of errors, and:

$$\sigma'(X) = \sigma_mX^{2m} + \sigma_{m-1}X^{2m-2} + \ldots + \sigma_1X^2 + \sigma_0$$

(5) Error Correction (FIG. 10)

This is the process of adding the error magnitudes (E's) to the received data at the locations corresponding to the $\beta$'s. This produces the corrected codeword, C(X).

Decoding Means 40

The modules for each of the five steps of the decoding means will now be described in detail. In the syndrome generator module 42 shown in FIG. 7, data is received from a RAM unit by pipeline register 102. This module consists of a matrix multiplication of 16,320 individual arithmetic operations performed by a total of 32 almost identical calculator circuits 104 and accumulator circuits 105. Each calculator circuit must perform 255 multiplications and 255 additions, via adders 106, in order to calculate one syndrome symbol S(X). The calculated syndrome is passed to the next module (the Euclid's Algorithm module) by a multiplexer 107. All operations are under control of a fixed sequence microprogram stored in a dedicated microcontroller 108.

The syndrome generator module is by far the largest circuit complex in the decoder. All 32 calculator circuits 104 run simultaneously and calculate the complete syndrome symbol in about 15 microseconds. This is an equivalent rate of over a billion operations per second. The rate is set this high in order that the decoding be done in real time, and if the syndrome symbols turn out to be all zero, as is often the case, that codeword is error free and the next codeword can be processed immediately. The microcontroller allows the internal processing of this module to be pipelined so that work can start on the next codeword before the present one is entirely completed.

The Euclid's algorithm module 44, shown in FIG. 8, while not as large as the syndrome generator module, has more functions to perform, and thus is the most complex module in the decoder. It performs a series of polynomial divisions and multiplications to determine the greatest common divisor between two polynomials in order to compute the error locator polynomial $v(X)$ and the error magnitude evaluator polynomial $\omega(X)$.

The syndrome $S(X)$ polynomials are received from the syndrome generator module and stored in a FIFO 112. The calculations of this step are performed serially on the polynomial coefficients, as they are shifted out of the FIFO 112, using coefficients R, T and A stored FIFOs 114, 116 and 118. When a predetermined condition is reached, as determined by select units 114a and 118a, the computation stops, except in unit 119 which then extracts the derivative $\sigma'(X)$ of the error locator $\sigma(X)$ by merely removing its odd powered terms, at which time the module contains at outputs 114b, 118b and 119c the error magnitude evaluator polynomial $\omega(X)$ and the error locator polynomial $\sigma(X)$, and the derivative $\sigma'(X)$, all under control of a microcontroller 120. The various arithmetic operations required are indicated by the arithmetic function symbols +, × and ÷ in circles. Note that for division, two buffer registers 121 and 122 are provided. The output of the D register 121 is connected to a zero detect circuit 123 to determine when the syndrome $S(X)$ is zero. This allows the microcontroller to skip the step for the symbol and go on to the next one. For a complete description of Euclid's algorithm for polynomials, see The Theory of Information and Coding by Robert J. McEliece, in ENCYCLOPEDIA OF MATHEMATICS AND ITS APPLICATIONS, Addison-Wesley Publishing Co. (1977), Vol. 3, pp 175-8.

The Chien search module shown in FIG. 9, also under control of yet another microcontroller 130, locates the errors by finding the roots ($\beta$) of the error locating polynomial $\sigma(X)$. These roots point to the error locations in memory. The roots are found by dividing the error locating polynomial $\sigma(X)$ by some trial divisor $(X - \beta_i)$. If the remainder is zero, then $\beta_i$ is a root of $\sigma(X)$. The quotient now becomes the new dividend and the process is repeated as necessary until all roots are found. If the correct number of roots are not found, that is, if the polynomial does not completely factor, then the codeword contains more than 16 errors and is not correctable. The trial divisors are taken in order from $(X-1)$ to $(X-255)$. Implementation of the module comprises FIFO's 131 and 132 to store and shift the dividend and quotient, respectively, during division, a multiplier 133, an adder 134 and a zero detector 135. The adder actually performs the operation of subtracting after multiplying in the decimal arithmetic example below. Subtraction is equivalent to addition in this Galois Field, $GF(2^8)$, and is performed by exclusive-OR gates. A register 136 stores the remainder, and a counter 137 is incremented for producing the $\beta$'s used in the trial polynomials, all under control of the microcontroller 130.

The following is an example for the polynomial, $\sigma(X) = X^4 + 7X^3 + 13X^2 + 5X + 6$. Decimal arithmetic is used for illustration purposes; the actual arithmetic is binary Galois Field arithmetic.

$$X + 3 \overline{\smash{\big)}\, \begin{array}{l} X^3 + 4X^2 + X + 2 \\ X^4 + 7X^3 + 13X^2 + 5X + 6 \\ \underline{X^4 + 3X^3} \\ \quad 4X^3 + 13X^2 \\ \quad \underline{4X^3 + 12X^2} \\ \qquad X^2 + 5X \\ \qquad \underline{X^2 + 3X} \\ \qquad \quad 2X + 6 \\ \qquad \quad \underline{2X + 6} \\ \qquad \qquad 0 \end{array}}$$

In the module shown in FIG. 10, both error magnitude computation and error correction are combined. Error magnitude computation is performed in two steps, under the direction of a microcontroller 140. In the first step, the error magnitude evaluator polynomial $\omega(X)$ is received in a FIFO 142 and the derivative of the error locator polynomial $\sigma'(X)$ is received in a FIFO 144. From these the error magnitudes E$\beta$ and location $\beta$ are evaluated using the roots $\beta$ found by the Chien search module and received in FIFO register 146. This is done by shifting the two polynomials out of the FIFO's 142 and 144, evaluating the terms one by one, and accumulating the results in registers 148a and 148b. The evaluated error magnitude polynomial $\omega(\beta)$ stored in the accumulator 148a is divided by the evaluated derivative of the error locator polynomial $\sigma'(\beta)$ in a circuit 150. The results are the actual error magnitudes E$\beta$. As noted hereinbefore, E$\beta$ is the ratio of $\omega(\beta)$ to $\sigma'(\beta)$.

The second step is the actual correction of the errors. The roots are used to access the symbol location in the RAM through a logarithm table 152 which converts the roots 8 into the address of the error by converting $\beta$ into $-\log \beta$. Then the error magnitude E$\beta$ is added to the symbol received from the RAM at that address to correct it. For that purpose, the received symbol is temporarily stored in a register 156. Lastly, the number of errors in the codeword is totaled by an error counter 158 and then transmitted to the RAM (to be transmitted to the host computer by the output module, as described earlier, at the end of the corrected codeword), all under control of the microcontroller 140.

In order to be able to decode in real time, the decoder 22 (FIG. 1) must be designed to process data at a minimum rate of 1 megabit per second under worst-case conditions. The worst case occurs at exactly 16 errors in a codeword. Processing a codeword having fewer errors requires less time; processing a codeword with more than 16 errors causes an early indication of inability to correct. The average data rate is roughly doubled by having the incoming data in a continuous stream, which is possible since the decoder can process in overlapping fashion by providing that the input, decoding, and output data processing modules have simultaneous access to various data sets in the RAM module.

Figure 11:
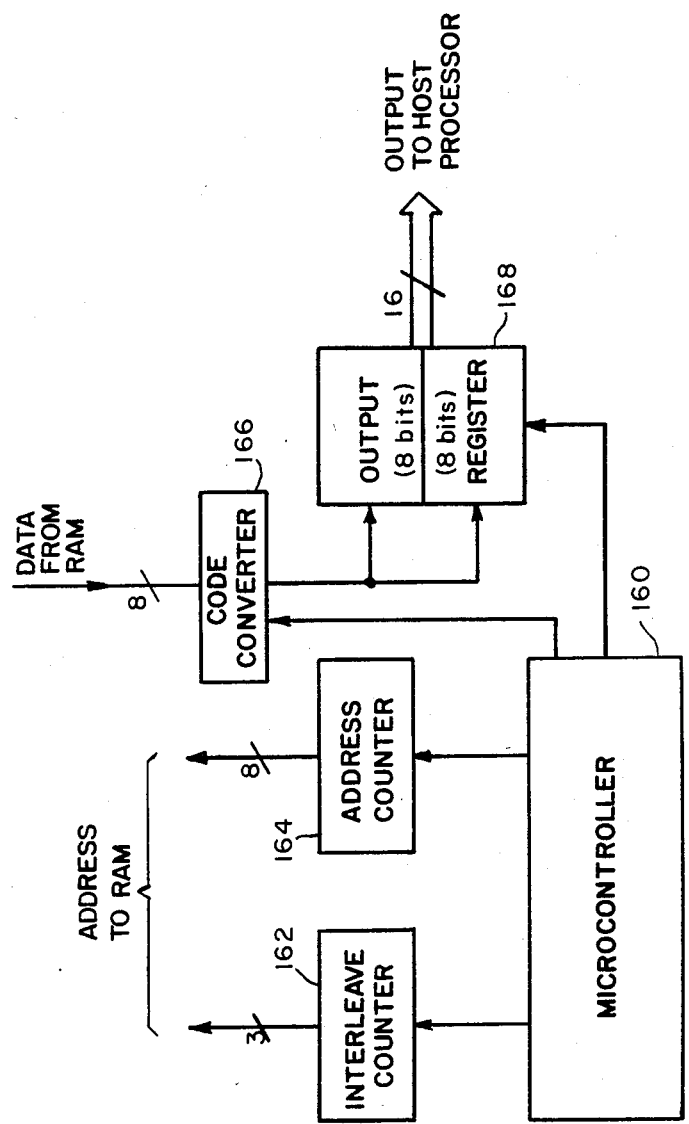
FIG. 11 is a block diagram of an output module.

The organization of the output module 26 is shown in FIG. 11. This module essentially reverses the procedure of the input module shown in FIG. 5. It is comprised of a microcontroller 160, an interleave counter 162 and address counter 164 used to address the RAM in module 30, a converter 166 for code conversion and an output register 168. A microcontroller 162 sequences the outputting procedures.

The output module reads the keyword from RAM to determine the depth of interleaving and the number of zeros to be reinserted. With these numbers, the microcontroller 160 presets the counters 162 and 164 which will generate the correct sequences of addresses for output of data. As the data is read, it is transmitted to the host processor 20 (FIG. 1).

The data block returned to the host processor will contain the corrected data bytes followed by the error counts. The parity bytes are not returned. The data bytes will be arranged exactly as they were downloaded. Immediately following the last byte of data will be the error bytes. These are called E (total bytes corrected) and e (total bits corrected). E and e bytes give error counts for one codeword only. Thus there will be one E and one e per codeword and there are I codewords in a block. These are appended to the data with no gaps and this block is then uploaded to the host processor in 16-bit words with the first byte being the most significant in a word. The last word may contain an unnecessary byte in the LSB position. The first bit in the E byte is the "failure to correct" bit which will only be set if the decoder was unable to perform decoding on the codeword due to an excessive number of errors.

Although particular embodiments of the invention have been described and illustrated herein, it is recognized that modifications and variations may readily occur to those skilled in the art. Consequently, it is intended that the claims be interpreted to cover such modifications and variations.

What is claimed is:

1. A decoder for decoding Reed-Solomon encoded data comprising
   input means for receiving said encoded data in a stream of code blocks,
   memory means coupled to said input means for storing said received encoded data,
   processing means coupled to said memory means for performing decoding functions on said stored encoded data and returning processed data to said memory,
   output means coupled to said memory means for transmitting decoded data from said decoder,
   said memory means including three identical memories, one for storing encoded data to be decoded, one for storing data being decoded, and one for storing decoded data being transmitted out of the decoder, each memory having its own addressing means and data output terminals,
   means for determining when each of said input means, processing means and output means have completed their respective functions on a different code block, and
   switching means responsive to said determining means for sequentially swapping memories between said input means, processing means and output means, whereby overall pipelining of code blocks is provided through said decoder without physically transferring code blocks through more than one memory.

2. A decoder as defined in claim 1 wherein said processing means is comprised of a plurality of sections, each for carrying out an algorithm step, and each pipelined such that data is pipelined through the decoding means for decoding while overall pipelining is affected by memory swapping.

3. A decoder as defined in claim 2 wherein said data is encoded in a Reed-Solomon code consisting of codewords made up of K data and N-K check symbols, where K is an arbitrary number and K is a number smaller than N, and each symbol is made up of J binary bits encoded with a generator polynomial g(X) and a field generating polynomial M(X) which defines the representation of the Galois field, and said processing means comprises the following sequentially pipelined processing means:
   pipelined means for generating a syndrome polynomial S(X) in response to each received codeword R(X), wherein said syndrome consists of m terms and has the form $$S(X) = S_m X^{m-1} + S_{m-1} X^{m-2} \ldots + S_2 X + S_1$$

and said received code word is defined as $$R(X) = R_o + R_1 X + R_2 X^2 \ldots R_{n-1} X^{N-1} + R_n X^N$$

pipelined means for computing Euclid's algorithm for determining an error locator polynomial $\sigma(X) = \sigma_j X^j + \sigma_{j-1} X^{j-1} \ldots + \sigma_1 X + \sigma_o$, where $1 \leq j \leq m/2$ and an error magnitude evaluator polymomial $\omega(X) = \omega_i X^i + \omega_{i-1} X^{i-1} \ldots \omega_i X + \omega_o$, where $i = j-1$,
   pipelined means for computing the roots $\beta$ of the error locator polynomial $\omega(X)$ to determine the location of errors,
   means for computing the error magnitudes $E\beta$ from the derivative $\sigma'(X)$ of the error locator polynomial, the error magnitude evaluator polynomial $\omega(X)$ and the root $\beta$ of the error locator polynomial, comprising means for computing $\sigma'(\beta)$ and $\omega(\beta)$, and means for computing $E\beta = \sigma(\beta)/\omega(\beta)$, and
   pipelined means for correction of error by adding the error magnitudes at the proper locations found by taking the negative logrithm of the error locator root $\beta$.

4. A decoder as defined in claim 3 wherein each code block received includes a keyword which specifies for the decoder the generator polynomial g(X) to be used, whereby said decoder may decode a number of different Reed-Solomon codes generated with a different generator polynomial.

5. A decoder as defined in claim 4 wherein each keyword of a code block received specifies the depth of interleaving of symbols, and including means for deinterleaving a code block and arranging it into codewords for processing.

6. A method of decoding Reed-Solomon encoded data received in a stream of encoded blocks comprised of five sequential algorithms through which each block of data is processed for decoding consisting of
   generating a syndrome polynomial S(X) in response to each received codeword R(X), wherein said syndrome consists of m terms and has the form $$S(X) = S_m X^{m-1} + S_{m-1} X^{m-2} \cdots + S_2 X + S_1$$

and said received code word is defined as $$R(X) = R_o + R_1 X + R_2 X^2 \cdots R_{n-1} X^{N-1} + R_n X^N$$

computing Euclid's algorithm for determining an error locator polynomial $\sigma(X) = \sigma_j X^j + \sigma_{j-1} X^{j-1} \cdots + \sigma_1 X + \sigma_o$, where $1 \leq j \leq m/2$ and an error magnitude evaluator polynomial $\omega(x)$ and $\omega_i X^i + \omega_{i-1} X^{i-1} \ldots \omega_1 X + \omega_o$, where i is the ith term of the evaluator polynomial $\omega(X)$, and is equal to $j-1$, where j is the jth term of the error locator polynomial, computing the roots $\beta$ of the error locator polynomial $\omega(X)$ to determine the location of errors, computing the error magnitudes $E\beta$ from the derivative $\sigma'(X)$ of the error locator polynomial, the error magnitude evaluator polynomial $\omega(X)$ and the root $\beta$ of the error locator polynomial, comprising means for computing $\sigma'(\beta)$ and $\omega(\beta)$, and means for computing $E\beta = \sigma(\beta)/\omega(\beta)$, and correcting errors by adding the error magnitudes at locations found by taking the negative logrithm of the error locator root $\beta$, wherein each code block received includes a keyword which specifies for the decoder the generator polynomial $g(X)$ to be used, whereby said decoder may decode a number of different Reed-Solomon codes generated with a different generator polynomial.

7. A method of decoding Reed-Solomon encoded data as defined in claim 6 wherein each keyword of a code block received specifies the depth of interleaving of symbols, and including means for deinterleaving a code block and arranging it into codewords for processing.

8. A method of decoding Reed-Solomon encoded data as defined in claim 7 wherein codewords are pipelined through the sequential algorithms, thereby eliminating delays by allowing processing to begin on a codeword before decoding is completed on a first codeword.

9. A method of decoding Reed-Solomon encoded data as defined in claim 8 wherein the number of errors in a codeword is totaled for transmsittal with the decoded data.

* * * * *